(12) United States Patent  
Donhauser et al.

(10) Patent No.: US 8,998,654 B2
(45) Date of Patent: Apr. 7, 2015

(54) INDUSTRIAL AUTOMATION TECHNOLOGY INPUT/OUTPUT MODULE

(71) Applicant: Siemens Aktiengesellschaft, Munich (DE)

(72) Inventors: Peter Donhauser, Amberg (DE); Gennadij Drehmann, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/744,541

(22) Filed: Jan. 18, 2013

(65) Prior Publication Data

US 2013/0196552 A1    Aug. 1, 2013

(30) Foreign Application Priority Data

Jan. 31, 2012    (EP) .................................... 12153252

(51) Int. Cl.
| | |
|---|---|
| *H01R 9/24* | (2006.01) |
| *H01R 13/02* | (2006.01) |
| *H01R 31/08* | (2006.01) |
| *H05K 7/14* | (2006.01) |
| *H01R 9/26* | (2006.01) |
| *H01R 107/00* | (2006.01) |

(52) U.S. Cl.
CPC ................ *H01R 13/02* (2013.01); *H01R 31/08* (2013.01); *H05K 7/1469* (2013.01); *H01R 9/2675* (2013.01); *H01R 2107/00* (2013.01); *Y10S 439/922* (2013.01)

(58) Field of Classification Search
CPC ....................................................... H01R 9/24
USPC .................................................. 439/709, 922
See application file for complete search history.

(56) References Cited

U.S. PATENT DOCUMENTS

| | | | | |
|---|---|---|---|---|
| 4,313,147 | A | * | 1/1982 | Uchida et al. ................. 361/119 |
| 4,651,340 | A | * | 3/1987 | Marson ......................... 379/156 |
| 4,701,134 | A | | 10/1987 | Jones |
| 4,738,632 | A | * | 4/1988 | Schmidt et al. ............... 439/341 |
| 4,851,967 | A | * | 7/1989 | Gerke et al. .................. 361/823 |
| 5,114,356 | A | * | 5/1992 | Taybl et al. ................... 439/713 |
| 5,160,273 | A | * | 11/1992 | Carney .......................... 439/108 |
| 5,224,881 | A | * | 7/1993 | Lejuste et al. ................ 439/709 |

(Continued)

FOREIGN PATENT DOCUMENTS

| | | |
|---|---|---|
| CN | 1606195 | 4/2005 |
| DE | 195 14 842 | 11/2004 |
| EP | 0 190 308 | 8/1986 |

*Primary Examiner* — Neil Abrams
(74) *Attorney, Agent, or Firm* — Cozen O'Connor

(57) ABSTRACT

An industrial automation technology input/output module includes a base section with front and rear sides, a printed circuit board, a contact strip on the front side with a plurality of contact elements configured to make an electrical connection with corresponding mating contact elements of a connector strip, wherein the contact elements are electrically connected to the printed circuit board, a device for forwarding a supply voltage for the printed circuit board is disposed parallel to the contact strip, the device includes a terminal point and the connector strip is formed to include a plurality of mating terminal points electrically connected to respective mating contact elements, and the supply voltage is switched to the printed circuit board via a link element that is insertable into the terminal point and the mating terminal point to interconnect a pair of opposed contact elements and to supply voltage to the printed circuit board.

14 Claims, 8 Drawing Sheets

(56) References Cited

U.S. PATENT DOCUMENTS

| | | | |
|---|---|---|---|
| 5,249,979 A * | 10/1993 | Deinhardt et al. | 439/341 |
| 5,297,970 A * | 3/1994 | Carney | 439/108 |
| 5,494,461 A * | 2/1996 | Bippus et al. | 439/709 |
| 5,791,916 A * | 8/1998 | Schirbl et al. | 439/76.1 |
| 6,074,257 A * | 6/2000 | Fasano | 439/713 |
| 6,196,862 B1 * | 3/2001 | Dooley | 439/412 |
| 6,425,770 B1 * | 7/2002 | Lostoski et al. | 439/76.1 |
| 6,916,212 B2 * | 7/2005 | Bennia-Latreche | 439/709 |
| 7,207,828 B2 * | 4/2007 | Tricaud et al. | 439/417 |
| 8,512,067 B2 * | 8/2013 | Denter et al. | 439/403 |
| 2010/0316101 A1 * | 12/2010 | Sau et al. | 375/222 |

* cited by examiner

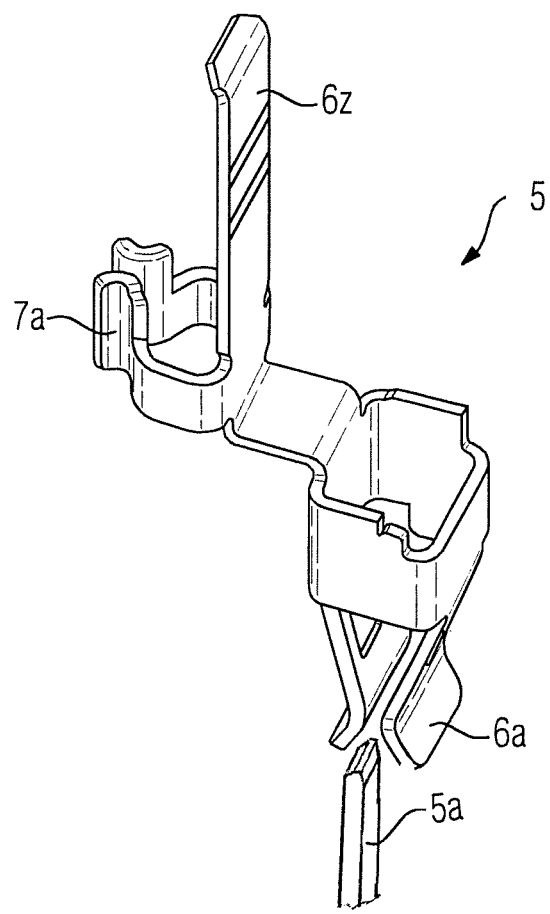

INDUSTRIAL AUTOMATION TECHNOLOGY INPUT/OUTPUT MODULE

BACKGROUND OF THE INVENTION

1. Field of the Invention

The invention relates to an industrial automation technology input/output module, comprising a base section with a front side and a rear side, a printed circuit board, a contact strip disposed on the front side with a plurality of contact elements configured to make an electrical connection with corresponding mating contact elements of a connector strip.

2. Description of the Related Art

DE 195 14 842 B4 discloses conventional input/output modules.

Input/output modules are used, for example, as analog and digital periphery modules in industrial automation technology. In digital-analog input/output modules electrical signals from an automation process are supplied via the connector strip or what is referred to as a front connector to the input/output module. In this technology, the printed circuit board contained in the input/output module has an electronic circuit that is designed for the respective application and thus executes closed-loop control tasks, open-loop control tasks or input/output forwarding of process signals. In a digital input/output module, for example, in addition to the signal lines, power lines must be connected for supplying a supply voltage to the printed circuit board. As a rule, power is supplied to eight signal lines by two power lines in each case. With a 32-channel module, for example, 4 times 2 power lines must thus also be connected for the 4 times 8 signal lines. With the conventional 32-channel modules, it is therefore necessary to also connect 4 times 2 power lines for the 4 times 8 signal lines. Consequently, it is disadvantageous in conventional modules that an undesirably high number of power lines has to be connected to the connector strip or to the front connector terminals.

SUMMARY OF THE INVENTION

It is therefore an object of the present invention to provide an industrial automation technology input/output module which makes it possible to reduce the number of power lines to be connected to the connector strip.

This and other objects and advantages are achieved in accordance with the invention by providing an input/output module described above in which a means for forwarding a supply voltage for the printed circuit module is disposed in parallel to the contact strip, where the means has one terminal point and the connector strip is configured such that it has a plurality of mating terminal points that are electrically connected to the respective mating contact elements, where the supply voltage is connected to the printed circuit board via a link element able to be plugged into the terminal point and the mating terminal point. Advantageously, a supply voltage can now be supplied to the printed circuit board via the terminal points and the mating terminal point when the link element is plugged in without additional wiring of power lines in the connector strip being necessary.

In an advantageous embodiment of the input/output module, the means is surrounded by an insulating body and is disposed in the area of the front side, such that with a connector strip plugged into the contact strip from the front side, the insulating body is disposed between the contact strip and the connector strip.

In a further embodiment, the means comprises a pair of conductors extending in a longitudinal direction, with a first conductor and a second conductor. Since, with these contemplated embodiment, the first conductor and the second conductor is disposed longitudinally in the contact strip, terminal points can be disposed on the first conductor and the second conductor at any given point of the first conductor and the second conductor and thus a supply voltage can be forwarded at any given points by means of the link element via the corresponding mating contact elements to the printed circuit board via the contact elements without additional wiring with power lines being necessary.

Consequently, it is advantageous for the means to have a first terminal point and a second terminal point that are disposed behind one another with respect to the longitudinal direction.

In a further advantageous embodiment, the contact strip comprises a first contact strip and a second contact strip and in the longitudinal direction the contact elements are disposed behind one another as a first contact row of the first contact strip and as a second contact row of the second contact strip.

It is furthermore of advantage for the insulating body to have a first receptacle for the first terminal point and a second receptacle for the second terminal point.

To arrange the feeding or the application of a supply voltage to the contact elements in the most user-friendly way possible, the input/output module is configured with the means for forwarding the supply voltage such that the terminal points disposed behind one another are disposed between the first contact row and the second contact row such that an inserted first link element electrically connects the first terminal point to a first mating terminal point and to a second mating terminal point, where the first mating terminal point is disposed in the first contact row and the second mating terminal point is disposed in the second contact row and an inserted second link element electrically connects the second terminal point to a third mating terminal point and to a fourth mating terminal point, and where the third mating terminal point is disposed in the first contact row and the fourth mating terminal point is disposed in the second contact row.

For an embodiment of an input/output module with a connector strip having a first contact row and a second contact row, where the first contact row is assigned to a first printed circuit board and the second contact row is assigned to the second printed circuit board, this does not always have to be the case, where the printed circuit boards similarly to inserted electronic circuit boards are disposed on the left-hand side or right-hand side in the base section which forms a housing, for example, the following arrangement is conceivable. The first terminal point of the means of forwarding the supply voltage is connected to the first electrical conductor which, for example, is connected to a plus line and the second terminal point of the means of forwarding the supply voltage is electrically connected to the second conductor, where the second conductor is connected to a minus line, for example. The aforementioned arrangement of the first mating terminal point in the first contact row and of the second mating terminal point in the second contact row, with a link element inserted, on the one hand enables the printed circuit board or circuit board arranged on the left-hand side to be supplied with the plus supply voltage and, on the other hand, the printed circuit board or circuit board arranged on the right-hand side to be supplied with the same plus supply voltage. A similar left and right-sided supply of the circuit boards with the minus supply voltage is also produced by this layout.

In a further optimized embodiment, the connector strip has openings for insertion of the link elements. With the openings, which are disposed in the insulating body, for example, a module-specific grid for insertion of link elements for a respective module, with a particular technology, for example, can be predetermined. This makes it possible only to connect the supply voltage by means of the link elements at a specific location.

It is also advantageous for the connector strip on the front side to be linked pivotably to the base section, which allows the connector strip to be put down onto the contact strip by means of a pivoting movement.

In order to facilitate the connection of a supply voltage to the means of forwarding the supply voltage, the first conductor has a first feeder contact and the second conductor has a second feeder contact, which are connected to a feeder terminal.

In an advantageous embodiment, the feeder terminal is disposed on the connector strip such that it makes contact after the pivoting movement on the contact strip with the first feeder contact and the second feeder contact and thus the supply voltage, which is supplied via a minus conductor and a plus conductor which are connected to the feeder terminal, is switched to the first and the second conductor. Two power lines, for example, 1 times minus and 1 times plus, can therefore be connected to the feeder terminal, which is advantageously latched mechanically to the connector strip. The pivoting of the connector strip, which is advantageously configured as a front connector, onto the input/output modules or onto the contact strip, causes the feeder terminal to make contact with the feeder contacts, where the contact elements of the contact strip likewise make contact with the mating contact elements of the connector strip.

To accommodate a plurality of technological functions on the printed circuit board, the printed circuit board comprises as a first circuit board and a second circuit board and the first and/or second circuit board in such cases have a number of function modules, where the function modules are each supplied with the supply voltage via the means of forwarding the supply voltage and power is supplied to two terminal points in the means in each case for each function module.

In the input/output module with the inserted link element, it is advantageous for the link element to have a first arm, a second arm and a third arm, and for the first and the second arm to be approximately the same length and disposed in the shape of a fork in relation to one another, the third arm is disposed at a fork point of the first and second arm and has a length which projects beyond the length of the first and second arm. Advantageously, the third arm is thus configured projecting beyond the first arm and the second arm, meaning that the terminal points disposed in the means that is disposed below the connector strip can thus be contacted by the projecting third arm of the link element.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment is explained in the drawings, in which:

FIG. 4 shows a metallic contact element that is disposed alongside a plurality of further contact elements within a connector strip;

DETAILED DESCRIPTION OF THE PREFERRED EMBODIMENTS

Figure 1:
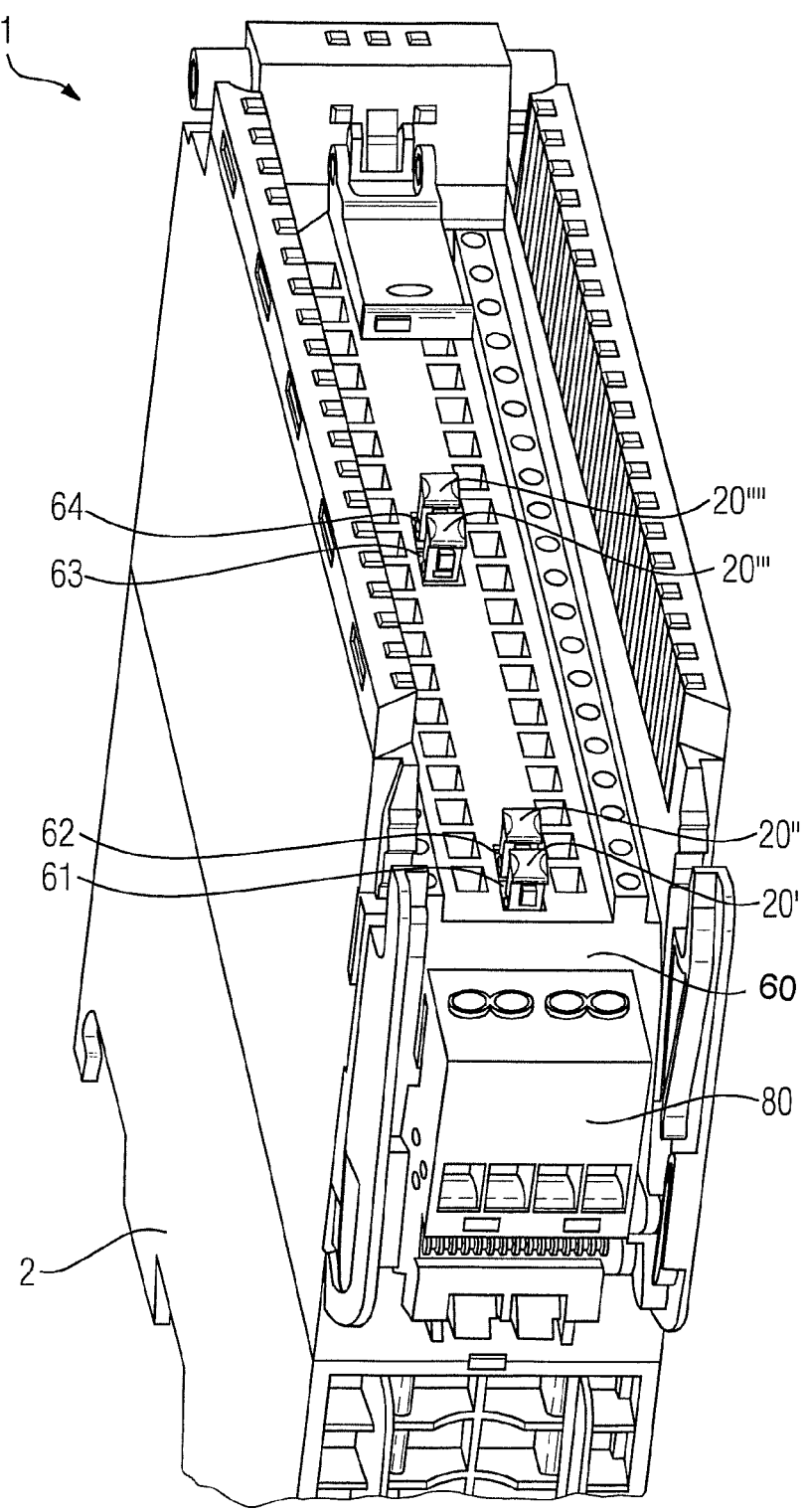
FIG. 1 shows a perspective view of an input/output module.

FIG. 1 shows an input/output module 1 for industrial automation. The input/output module 1 comprises a base section 2 with a front side 3 and a rear side 4, see also FIG. 2 in this connection, in which an input/output module 1 is depicted in a cutaway perspective diagram.

The input/output module 1 is preferably used in automation technology as an interface between an automation controller and a process to be automated. In such cases the input/output module 1 is as a rule connected via a bus system, for example, via a backplane bus, to the rear side 4, to a higher-ranking automation controller, where signal lines can be clamped to a connector strip able to be plugged into the input/output module 1. The signal lines are connected, for example, to sensors or actuators in the process to be automated.

Formed on the rear side 4 is a cutout with which the input/output module 1 is latched onto a profile rail and in this way makes contact with the backplane bus.

Figure 2:
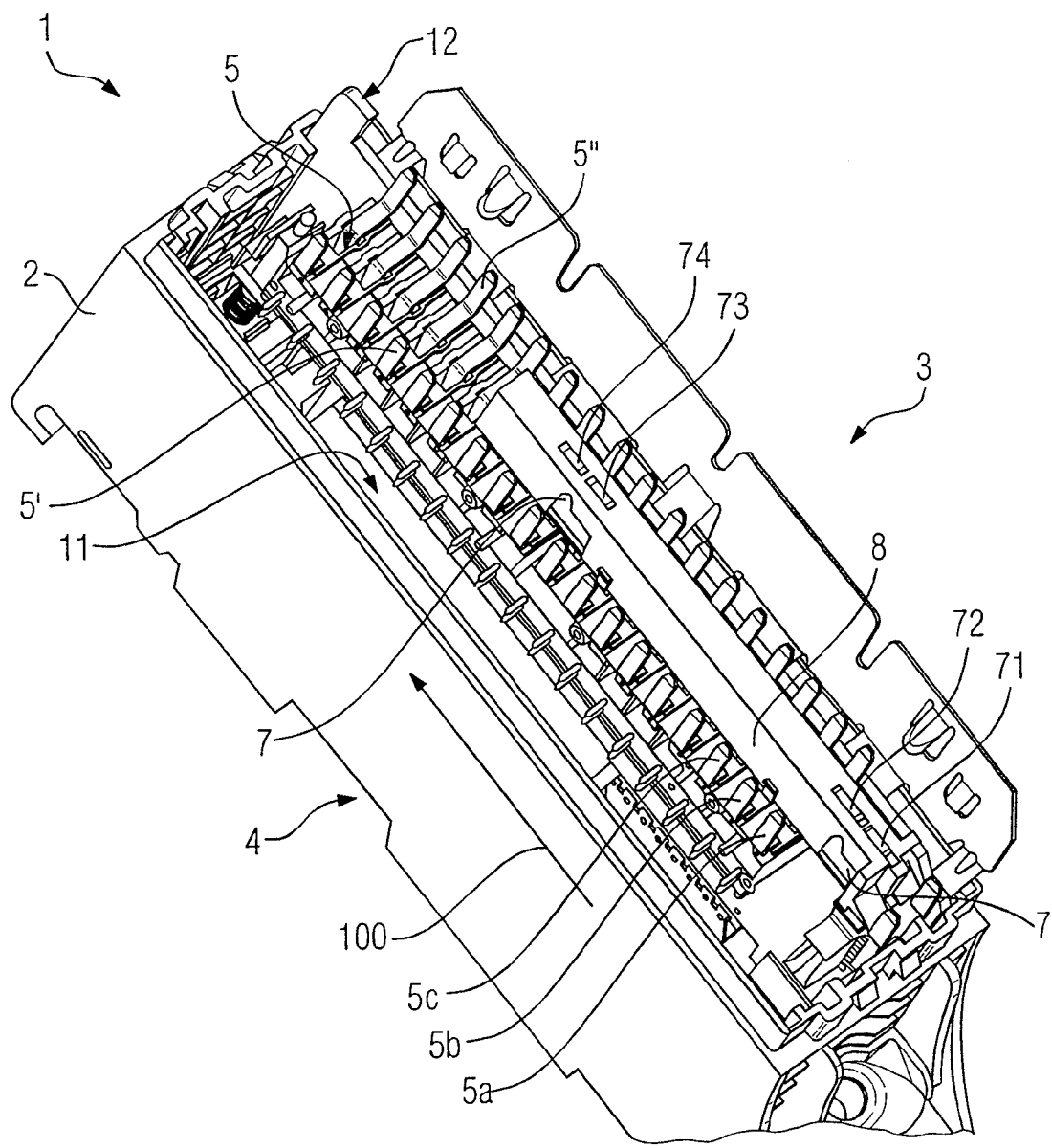
FIG. 2 shows the input/output module with a cutaway housing.

FIG. 2 shows that a first printed circuit board 11 and a second printed circuit board 12, which represent a first circuit board and a second circuit board, are located in the side sections of the input/output module 1, between these two printed circuit boards 11, 12 the contact strip 5 with a plurality of contact elements 5*a*, 5*b*, 5*c* etc. is disposed. The contact strip 5 is divided into a first contact strip 5' and a second contact strip 5", where the first contact strip 5' is assigned to the first printed circuit board 11 and the second contact strip 5" is assigned to the second printed circuit board 12.

The aforementioned contact strip arrangement is in no way to be understood as a restriction, the following cases could be chosen as embodiment variants.

Case 1: The input/output module comprises two equipped circuit boards, where each circuit board bears a male connector strip or contact strip.

Case 2: The input/output module comprises two equipped circuit boards, where only one circuit board bears a double male connector strip or contact strip.

Case 3: The input/output module comprises two equipped circuit boards, where only one circuit board bears a single-row male connector strip or contact strip.

A means 7 for forwarding a supply voltage for the printed circuit boards 11, 12 is disposed in parallel to the contact strip 5, where the means 7 has a first terminal point 71, a second terminal point 72, a third terminal point 73 and a fourth terminal point 74. Corresponding plug-in link elements 20 (see FIG. 6) can later be plugged into the first to fourth terminal point 71, . . . , 74 for connecting the supply voltage to the printed circuit board.

In accordance with FIG. 1, the contact strip 5 has a surrounding housing 60 that is equipped with corresponding openings 61, 62, 63 and 64 for plugging in link elements 20. The number of openings is basically not restricted to four, twenty openings could also be provided, for example.

According to the example depicted in FIG. 1, a first link element 20', a second link element 20'', a third link element 20''' and a fourth link element 20'''' are plugged in. The link elements 20', . . . , 20'''' penetrate the surrounding housing 60 of the contact strip 5 and make contact via contact elements, as are shown in FIG. 4, with the means for forwarding the supply voltage.

Figure 5A:
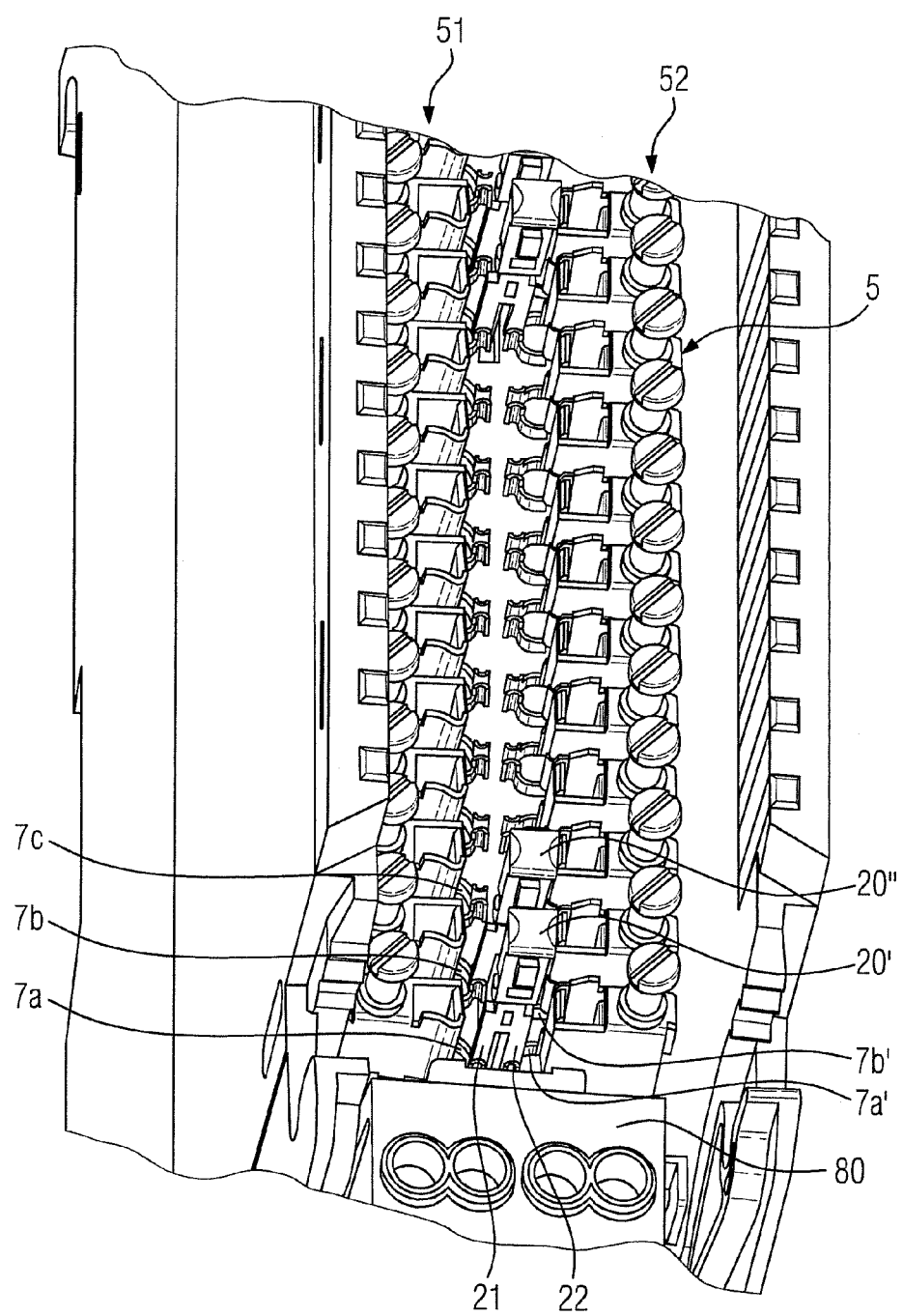
FIGS. 5*a* and 5*b* show the input/output modules in a detailed view.
Figure 5B:
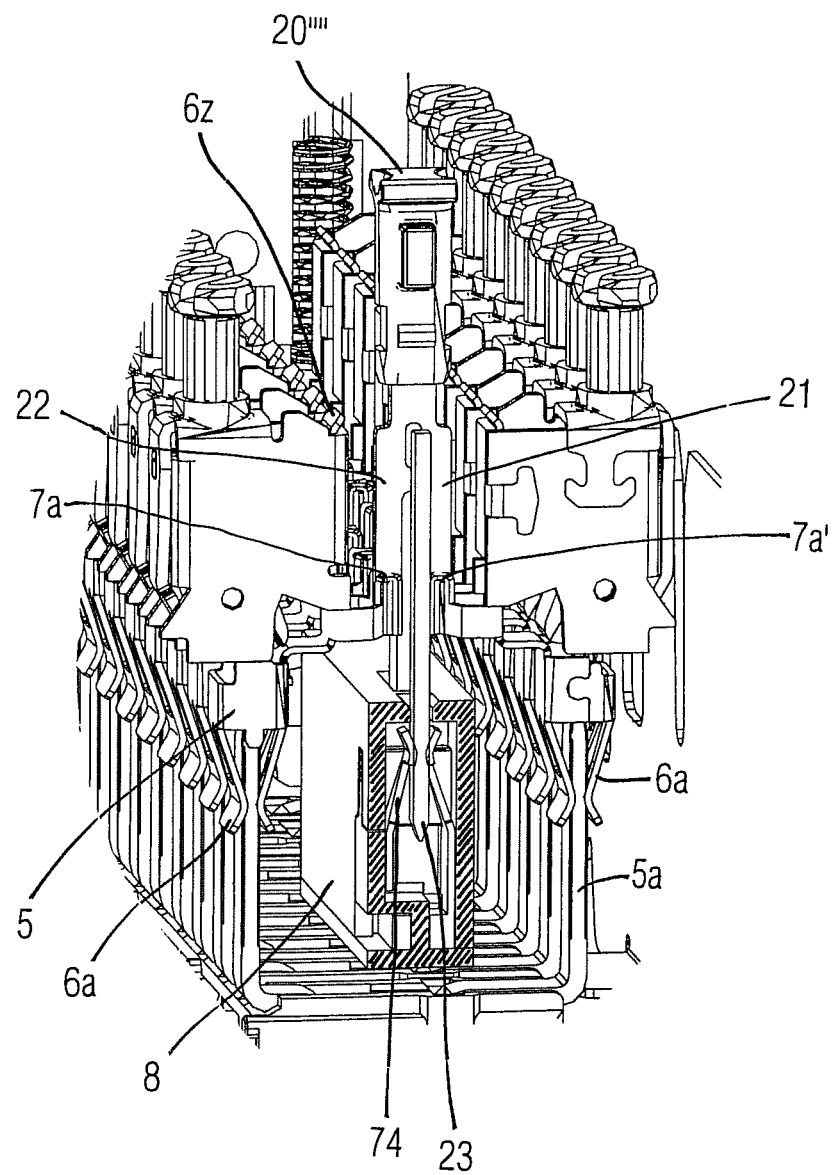

FIGS. 5a and 5b, in which the surrounding housing 60 has been removed, show a more detailed view of contact, where the first link element 20' is inserted into the contact strip 5 such that a first arm 21 makes contact with a first mating terminal point 7a and a second arm 22 makes contact with the second mating terminal point 7a'. A third arm 23 in this case contacts the first terminal point 71 (see FIGS. 3a and 3b).

Figure 6:
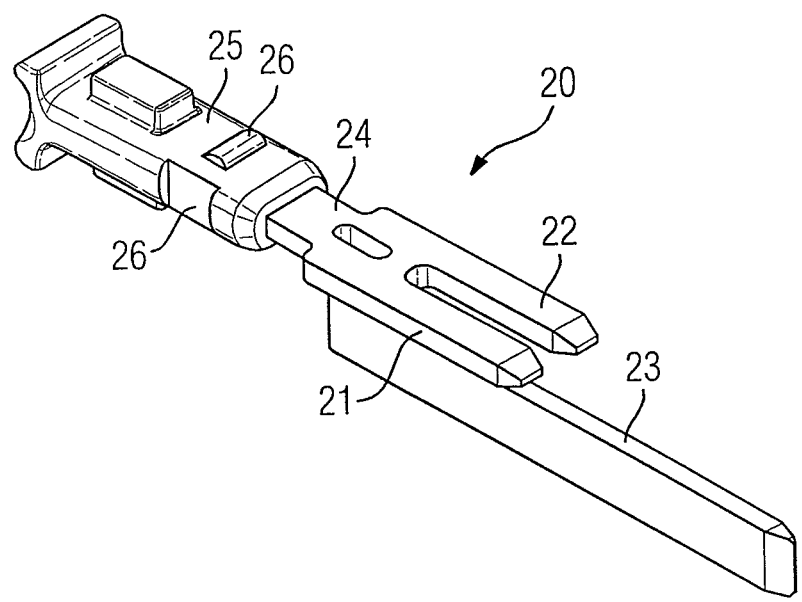
FIG. 6 shows a link element.

For the layout of the link element 20 see FIG. 6. FIG. 6 shows the link element 20 with a first arm 21 and a second arm 22 and a third arm 23. The first arm 21 and the second arm 22 are approximately the same length here and are arranged in the shape of a fork in relation to one another, and the third arm 23 is disposed at a fork point 24 of the first and second arm 21, 22 and has a length which projects beyond the length of the first and second arm 21, 22. The arms 21, 22 and 23 merge into a handle 25 which has additional latching lugs 26.

As shown in FIG. 5, the contact strip 5 is divided into a first contact row 51 and a second contact row 52, where the first terminal point 71 and the second terminal point 72 in accordance with FIG. 2 are disposed behind one another and are disposed in the first contact row 51 and the second contact row 52 such that the inserted first link element 20' electrically connects the first terminal point 71 (see FIGS. 3a and 3b) with a first mating terminal point 7a and with a second mating terminal point 7a', where the first mating terminal point 7a is disposed in the first contact row 51 and the second mating terminal point 7a' is disposed in the second contact row 52 and a further inserted second link element 22' electrically connects the second terminal point 72 (see FIGS. 3a and 3b) to a third mating terminal point 7b and to a fourth mating terminal point 7b', and where the third mating terminal point 7b is disposed in the first contact row 51 and the fourth mating terminal point 7b' is disposed in the second contact row 52.

Figure 3A:
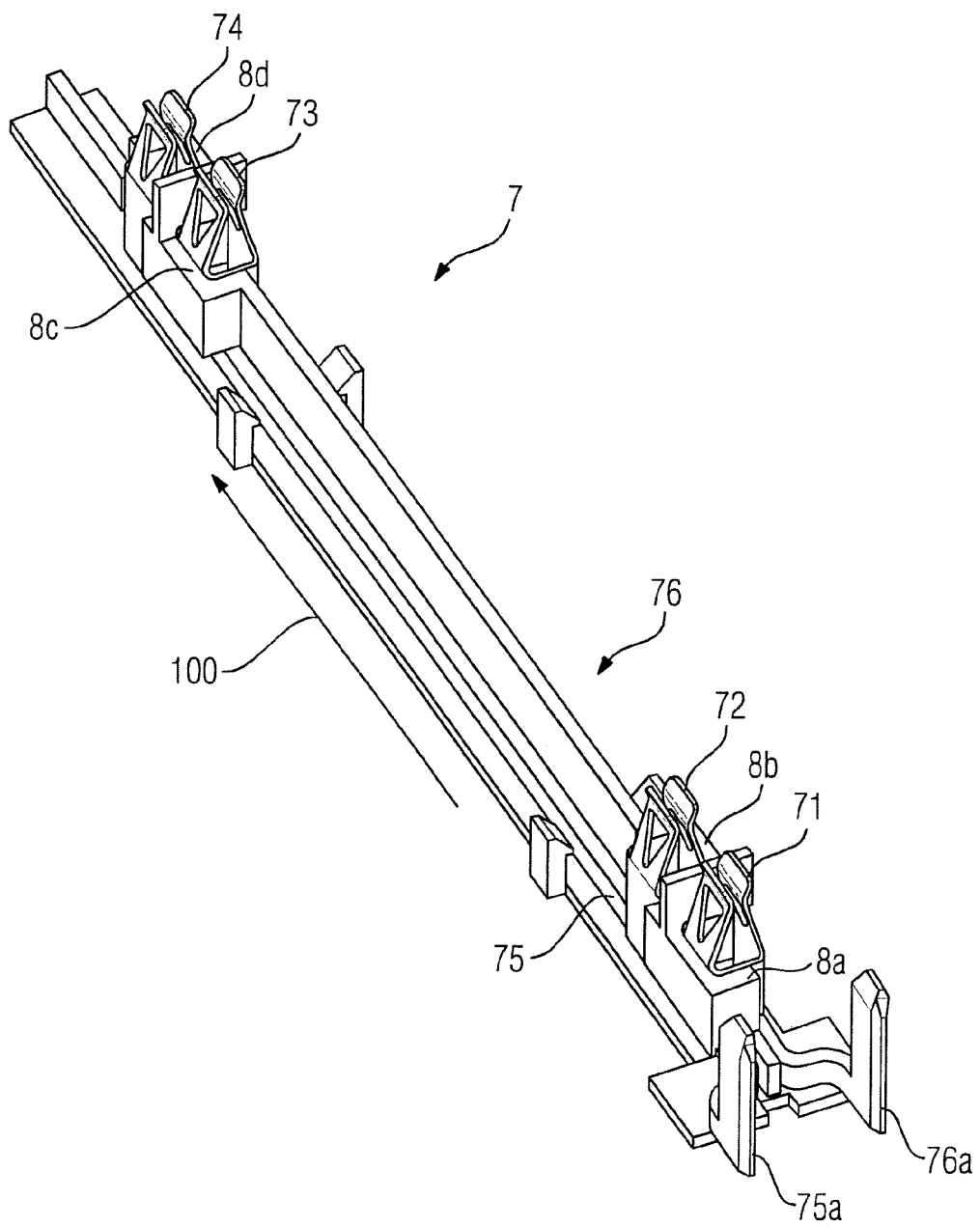
FIGS. 3*a* and 3*b* show a means for forwarding a supply voltage.
Figure 3B:
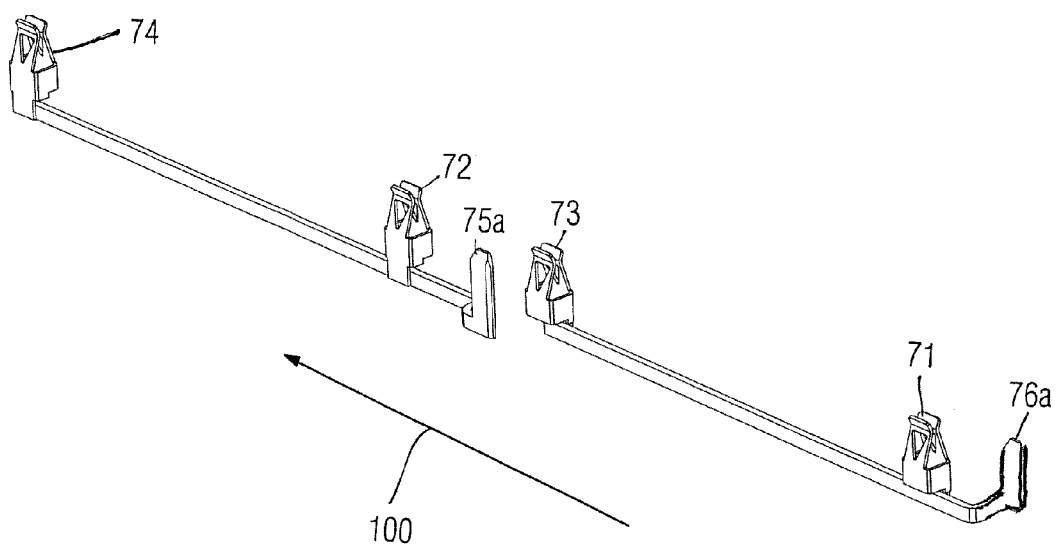

To better understand the through-contacting of a supply voltage the reader is referred to FIGS. 3a and 3b.

FIG. 3a shows a means 7 for forwarding the supply voltage, and FIG. 3b is an exploded view of the means 7 but without the first and second receptacles 8a, 8b. The means 7 extends in a longitudinal direction 100 with a first conductor 75 and a second conductor 76. The first conductor 75 and the second conductor 76 are embedded in a plastic molded part such that they are insulated from one another. The first terminal point 71 is electrically connected to the first conductor 75 and the second terminal point 72 is electrically connected to the second conductor 76. In a similar manner, the third terminal point 73 and the fourth terminal point 74 are likewise connected to the first conductor 75 or the second conductor 76 and electrically insulated from one another by the plastic part. For improved rigidity of the first terminal point 71 through to the fourth terminal point 74 the plastic part has a first receptacle 8a, a second receptacle 8b, a third receptacle 8c and a fourth receptacle 8 d. The terminal points 71, . . . , 74 are secured in these receptacles 8a, . . . , 8d.

The previously described means 7 for forwarding the supply voltage in accordance with FIGS. 3a and 3b must be imagined, when looking at FIGS. 5a and 5b, as being disposed below the first contact row 51 and the second contact row 52, because when the first link element 20' is inserted the third arm 23 of the link element, which is formed significantly longer, contacts the first terminal point 71 of the means 7 of forwarding the supply voltage and can thus forward a positive supply voltage or the current generated by the voltage applied to a first feeder contact 75a via the third arm 23 into the first arm 21 and into the second arm 22 and thus ultimately via the mating terminal points 7a, 7b via the mating contact elements 6a, 6b of the contact strip 5 to a contact element 5a, 5b (cf. FIG. 4). The contact element 5a, 5b is connected with the left-side or right-side printed circuit board disposed in the input/output module 1. Consequently, the supply voltage is forwarded to the printed circuit boards 11, 12.

The signal lines already mentioned, which lead to actuators or sensors in a process to be automated can, as is indicated in FIGS. 5a and 5b, be clamped onto the connector strip with screw-type terminal connections.

In accordance with FIG. 1, the input/output module 1 has a feeder terminal 80 to which, for example, a plus conductor and a minus conductor for feeding in a supply voltage can be connected.

If a connector strip is now connected pivotably on the front side 3 to the base section 2, the connector strip is able to be put onto the contact strip by means of a pivotal movement and a plus line or minus line connected to the feeder terminal 80 would also, by putting the feeder terminal on the first feeder contact 75a and on the second feeder contact 76a, connects the supply voltage to the means 7 of forwarding the supply voltage. Advantageously a "supply voltage bus" is now available within the contact strip 5. It is now no longer necessary to route a number of power lines into the connector strip and also connect these. Advantageously a 32-channel input/output module can now for example be supplied by two power lines, i.e., 1 times minus and 1 times plus. In accordance with the prior art eight power lines were necessary for this purpose.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An industrial automation technology input/output module, comprising:
    a base section including a front side and a rear side;
    a printed circuit board;
    a contact strip disposed on the front side and including a plurality of contact elements configured to make an electrical connection with corresponding mating contact elements of a connector strip; and
    means for forwarding a supply voltage for a printed circuit board disposed in parallel to the contact strip and including a terminal point;
    wherein the connector strip is formed to include a plurality of mating terminal points electrically connected to respective mating contact elements;

wherein the supply voltage is switched to the printed circuit board via a link element insertable into a terminal point of the plurality of terminal points and into the mating terminal point; and wherein the contact elements are electrically connected to the printed circuit board.

2. The input/output module as claimed in claim 1, wherein the means for forwarding the supply voltage is surrounded by an insulating body and is disposed in an area of the front side such that, for the connector strip plugged into the contact strip from the front side, the insulating body is disposed between the contact strip and the connector strip.

3. The input/output module as claimed in claim 1, wherein the means for forwarding the supply voltage is formed as a pair of conductors extending in a longitudinal direction with a first conductor and a second conductor.

4. The input/output module as claimed in claim 2, wherein the means for forwarding the supply voltage is formed as a pair of conductors extending in a longitudinal direction with a first conductor and a second conductor.

5. The input/output module as claimed in claim 3, wherein the means for forwarding the supply voltage include a first terminal point and a second terminal point which, with respect to the longitudinal direction, are disposed behind one another.

6. The input/output module as claimed in claim 1, wherein the contact strip comprises a first contact strip and a second contact strip and in a longitudinal direction the contact elements are disposed as a first contact row of the first contact strip and as a second contact row of the second contact strip behind one another.

7. The input/output module as claimed in claim 2, wherein the insulating body includes a first receptacle for a first terminal point and a second receptacle for a second terminal point.

8. The input/output module as claimed in claim 6, wherein terminal points arranged one behind another are disposed between the first contact row and the second contact row such that an inserted first link element connects a first terminal point electrically to a first mating terminal point and to a second mating terminal point, a first mating terminal point being disposed in the first contact row, and a second mating terminal point being disposed in the second contact row, and such that an inserted second link element connects a second terminal point electrically to a third mating terminal point and to a fourth mating terminal point, the third mating terminal point being disposed in the first contact row and the fourth mating terminal point being disposed in the second contact row.

9. The input/output module as claimed in claim 7, wherein terminal points arranged one behind another are disposed between the first contact row and the second contact row such that an inserted first link element connects a first terminal point electrically to a first mating terminal point and to a second mating terminal point, a first mating terminal point being disposed in the first contact row, and a second mating terminal point being disposed in the second contact row, and such that an inserted second link element connects a second terminal point electrically to a third mating terminal point and to a fourth mating terminal point, the third mating terminal point being disposed in the first contact row and the fourth mating terminal point being disposed in the second contact row.

10. The input/output module as claimed in claim 2, wherein the contact strip includes openings for insertion of link elements.

11. The input/output module as claimed in claim 2, wherein the connector strip is connected pivotably on the front side to the base section, by which the connector strip is pivotally placeable onto the contact strip.

12. The input/output module as claimed in claim 3, wherein a first conductor includes a first feeder contact and a second conductor includes a second feeder contact which are connected to a feeder terminal.

13. The input/output module as claimed in claim 1, wherein the printed circuit board comprises a first circuit board and the second circuit board and at least one of the first and the second circuit board include function modules which are each supplied with the supply voltage via the means for forwarding the supply voltage and two terminal points are provided in the means for each function module of the number of function modules.

14. The input/output module as claimed in claim 1, further comprising:

a link element inserted into input/output module;

wherein the inserted link element includes a first arm, a second arm and a third arm, and the first and the second arm are approximately a same length and arranged in relation to one another in a fork shape, the third arm being disposed at a fork point of the first and second arms and has a length which projects beyond a length of the first and second arms.

* * * * *